US012272611B2

(12) United States Patent
Beeby et al.

(10) Patent No.: US 12,272,611 B2
(45) Date of Patent: Apr. 8, 2025

(54) ELECTRONIC TEXTILE ASSEMBLY HAVING ELECTRONIC COMPONENTRY WHICH IS PROVIDED ON A SUBSTRATE AND ENCAPSULATED BY A FILM

(71) Applicant: University of Southampton, Southampton (GB)

(72) Inventors: Stephen Paul Beeby, Southampton (GB); Michael John Tudor, Southampton (GB); Menglong Li, Southampton (GB)

(73) Assignee: University of Southampton, Southampton (GB)

( * ) Notice: Subject to any disclaimer, the term of this patent is extended or adjusted under 35 U.S.C. 154(b) by 454 days.

(21) Appl. No.: 17/284,307

(22) PCT Filed: Oct. 11, 2019

(86) PCT No.: PCT/GB2019/052906
§ 371 (c)(1),
(2) Date: Apr. 9, 2021

(87) PCT Pub. No.: WO2020/074923
PCT Pub. Date: Apr. 16, 2020

(65) Prior Publication Data
US 2021/0398868 A1    Dec. 23, 2021

(30) Foreign Application Priority Data

Oct. 11, 2018 (GB) ..................................... 1816600

(51) Int. Cl.
*H01L 23/31*        (2006.01)
*D02G 3/44*         (2006.01)
(Continued)

(52) U.S. Cl.
CPC ......... *H01L 23/3121* (2013.01); *D02G 3/441* (2013.01); *H01L 21/56* (2013.01);
(Continued)

(58) Field of Classification Search
CPC . H01L 25/0655; H01L 21/56; H01L 23/3121; H01L 23/3135; H01L 23/4985; H01L 23/3107; H01L 23/49838
See application file for complete search history.

(56) References Cited

U.S. PATENT DOCUMENTS 6,729,025 B2 *  5/2004  Farrell .................... B32B 5/02
                                              29/854
10,966,316 B2 *  3/2021  Nakajima ................ H05K 1/02
(Continued)

FOREIGN PATENT DOCUMENTS

WO    WO-2017030851 A3 *  4/2017  ........... A41D 27/205

Primary Examiner — Alonzo Chambliss
(74) Attorney, Agent, or Firm — Steven Scott Lloyd

(57) ABSTRACT

The invention is that of an encapsulated electronic component assembly that may be incorporated into a textile or yarn. Electronic components is encapsulated in two flexible substrates forming a pod for housing the electronic components. A flexible substrate may be a flexible polymer film capable of compression in response to a bending force, protecting the internal electronic components. The components in the substrate may then be incorporated into a yarn or woven into a textile. The electronic components may comprise an antenna, data processor, light emitter, accelerometer, or other components.

18 Claims, 5 Drawing Sheets

(51) Int. Cl.
  *H01L 21/56* (2006.01)
  *H01L 23/498* (2006.01)
  *H01L 25/065* (2023.01)
  *H01L 23/00* (2006.01)

(52) U.S. Cl.
  CPC ...... *H01L 23/3135* (2013.01); *H01L 23/4985* (2013.01); *H01L 25/0655* (2013.01); *D10B 2401/18* (2013.01); *H01L 23/49838* (2013.01); *H01L 24/16* (2013.01); *H01L 24/32* (2013.01); *H01L 2224/16227* (2013.01); *H01L 2224/32227* (2013.01)

(56) References Cited

U.S. PATENT DOCUMENTS

| | | |
|---|---|---|
| 2005/0212405 A1 | 9/2005 | Cree |
| 2007/0049147 A1* | 3/2007 | Hill ........................ D03B 11/00 442/117 |
| 2008/0258314 A1* | 10/2008 | Yoo ........................ H01L 23/14 257/784 |
| 2011/0193105 A1 | 8/2011 | Lerman et al. |
| 2011/0198632 A1* | 8/2011 | Lerman ................... H01L 33/08 257/91 |
| 2013/0208938 A1* | 8/2013 | Midha ...................... H04R 1/44 340/870.02 |
| 2015/0181692 A1* | 6/2015 | Jezewski ................ H05K 1/038 361/749 |
| 2015/0188340 A1* | 7/2015 | Edwards ............... H02J 7/0045 320/103 |
| 2016/0192474 A1 | 6/2016 | Niskala et al. |
| 2016/0322283 A1 | 11/2016 | McMahon |
| 2017/0094776 A1 | 3/2017 | Heikkinen et al. |
| 2017/0170676 A1* | 6/2017 | Cheah ................. H01L 23/3121 |
| 2017/0223846 A1* | 8/2017 | Elolampi ............... H05K 1/181 |
| 2017/0275789 A1 | 9/2017 | Dias |
| 2018/0087193 A1 | 3/2018 | Fu |

* cited by examiner

ELECTRONIC TEXTILE ASSEMBLY HAVING ELECTRONIC COMPONENTRY WHICH IS PROVIDED ON A SUBSTRATE AND ENCAPSULATED BY A FILM

TECHNICAL FIELD

The present invention relates generally to functional electronic textiles.

BACKGROUND

Textiles are ubiquitous and are used, for example, in clothing, home furnishings as well as medical, automotive and aerospace applications, but their functionality is typically limited to their appearance and physical properties. There is considerable and growing interest in electronics textiles (e-Textiles) that add electronic functionality to textiles. For the avoidance of doubt by use of the term 'textile' we also include 'fabric'. E-Textiles offer a far greater range of functionality that can include sensing, data processing and interaction with the user, provide output signals and, as a result, can be applied in a vast range of applications potentially wherever textiles are present. The potential for the technology is enormous and the ability to reliably incorporate electronics in textiles has the potential to transform the textile industry. This area may be termed generally as functional electronic textiles, or E-textiles.

E-textiles may be defined as including the incorporation of electronic functionality into textiles. One of the main challenges for E-textiles is ensuring that the electronic components survive the physical demands of use, which for wearable textiles includes washing. The physical stresses involved can be significant and devices typically fail mechanically.

Traditional so-called 'glob top' protection for electronic componentry cannot withstand such rigours of use and washing, and therefore is not suitable for use in e-textiles.

The present invention seeks to provide to a product and assembly method that enables the reliable packaging of advanced electronic components (e.g. microcontrollers, sensors) which may be in ultra-thin die form and which are provided within a textile yarn.

SUMMARY

According to a first aspect of the invention there is provided an encapsulated electronic componentry assembly, suitable for incorporation into a textile or a yarn, and the assembly comprising two flexible substrates which encapsulate the electronic componentry, at least one of the flexible substrates comprising a preformed relief region, which provides a volume which at least in part accommodates the encapsulated componentry, or at least one of the flexible substrates when applied to encapsulate the componentry adopts a conformal relief, and the componentry located substantially at or on a neutral axis of the assembly.

By 'electronic componentry' we include one or more electronic components or elements, which may be passive or active components/elements.

The invention may be viewed as packaging the electronic componentry within two flexible substrates, at least one of which is pre-formed with an enclosing relief.

The relief region may comprise a protrusion or a boss or an upstand portion. The relief region may comprise a containing cover.

The at least one substrate may comprise a transitional or junction portion which connects the relief region to a surrounding part of said flexible substrate. The transitional region may form a side wall of the relief region. The transitional portion may have a curved shape when viewed in cross-section. The transitional portion may have a substantially non-square or non-rectilinear cross-sectional profile, or indeed of any geometric profile or shape in cross-section, such as curved or linear. The transitional region may preferably be substantially devoid of square, angular or sharp corner regions. The transitional region may comprise a shoulder formation.

The two substrates encapsulating the componentry may be termed a pod.

By neutral axis, we include a line or plane at which substantially no, or negligible, extension or compression occurs when the assembly is subjected to a bending force. Stated otherwise, this may include the axis at which there is substantially no compression or tension resulting from when a bending force applied. This preferably results in the electronic componentry experiencing little or substantially no flexure, or at least a minimum of flexure. The neutral axis may be termed a neutral bending plane, at which bending experienced is minimal.

At least one of the flexible substrates may comprise a film or layer, may comprise a polymer substrate, or may comprise a flexible polyimide substrate. The flexible substrate may be or comprise Kapton®, or may comprise any of Mylar®, polyester, polyimide, polyamide, PVC or PMMA.

The thickness of at least one of the substrates may be in the range 25 µm to 100 µm typically but may be up to 500 µm. The thickness of at least one of the substrates may be less than 25 µm. The widths of the encapsulated pods may be less than 5000 µm in width.

At least one of the flexible substrates may be a transparent or translucent, or comprise a transparent or translucent portion.

The componentry may comprise a deposited semiconductor, insulator or dielectric for example. Or the componentry may comprise a silicon die. The die may be a bare or packaged die. The die may be of silicon wafer-thickness or substantially thinner and the packaged die thicker.

The thickness of the die may be 25 µm or less or at or around 250 µm or substantially thicker, up to 1 mm.

At least one of the substrates may be provided with electrically conductive tracks and/or bump or bond pads typically of solder or adhesive.

The assembly may be woven into a textile, or incorporated into a yarn.

Adhesive or filler may be provided within a volume defined within the two substrates. The electronic componentry may be embedded in the adhesive or filler. The adhesive or filler may be provided adjacent to one side region of the electronic componentry and an opposing inner surface of the respective flexible substrate, and adjacent to an opposite side region of the electronic componentry and the inner surface of the respective flexible substrate. The adhesive may comprise an anisotropic adhesive.

The invention may be viewed as providing electronic functionality within a yarn, or incorporated into a textile.

At least one of the flexible substrates may include one or more conductive interconnects and/or bond/bump pads.

Multiple encapsulated assemblies may be individually encapsulated and electrically connected together by one or more electrical interconnects. It will be appreciated that a single assembly may contain multiple components.

Individual die may be applied to a flexible substrate which may be in the form of a strip (i.e. whose length dimension is greater than its width dimension), and encapsulated to form a die pod and conductive tracks on a (lower) substrate may electrically connect the die pods together forming a long, thin, flexible circuit or electronic filament. The die pods may be provided on the same or separate flexible substrate.

The electronic componentry may, in broad terms, be arranged to provide an output, receive an input and/or process data or signals. The electronic componentry may comprise an integrated circuit.

The componentry may comprise an antenna.

The componentry may include a radio frequency identification (RFID) circuitry (such as in the form of a chip).

The componentry may comprise a controller, which may be a micro-controller.

The componentry may comprise a signal processor or a data processor.

The componentry may comprise a light emitter.

The componentry may comprise an accelerometer.

The componentry may include a flexible circuit board or flexible circuitry.

The componentry may comprise passive or active electronic circuitry, or a combination of both. This may include one or more of: a sensor, an actuator a battery, a display, a connector and an energy harvester.

The componentry may comprise one or more thin or thick film components (for example evaporated or screen printed).

According to a second aspect of the invention there is provided a textile or yarn which is provided with the assembly of the first aspect of the invention.

Multiple encapsulated electronic componentry assemblies (which each may be considered as a module or unit) may be provided or distributed along a length of a yarn. At least some of the assemblies may be connected together so as to form an electronic circuit and/or one or more of the assemblies.

The assembly may be provided on a carrier yarn. The carrier and the assembly may be embedded within packing fibers. The packing fibers may be enclosed by covering fibers, or a covering material.

According to a third aspect of the invention there is provided a method of manufacturing an encapsulated electronic componentry assembly, which comprises bringing together a first flexible substrate and a second flexible substrate, and in which electronic componentry is provided between the first flexible substrate and the second flexible substrate, and at least one of the first flexible substrates is pre-formed with a relief formation which at least in part accommodates the electronic componentry, or at least one of the substrates being applied to the componentry such that it adopts a conformal relief when applied.

The method may comprise applying at least one of the substrates by way of a vacuum process.

The substrate applied by the vacuum process may be provided with a layer or potion of adhesive. The adhesive may be a thermally activated adhesive.

The adhesive may face the componentry.

The substrate applied by vacuum may be substantially devoid of pre-formed relief regions prior to its application.

The substrate may be applied directly to the componentry, or indirectly in the case that a filler or coating material is provided between the substrate and the componentry.

The substrate may substantially conform to the relief of the componentry when applied to encapsulate the componentry.

Where vacuum forming is used for applying the substrate, the other substrate on which the componentry is provided may be of a dissimilar material to that which is applied by a vacuum.

The invention may further comprise one or more features as described in the description and/or as shown in the drawings, either individually or in combination.

BRIEF DESCRIPTION OF THE DRAWINGS

Various embodiments of the invention will now be described, by way of example only, in which.

DETAILED DESCRIPTION

Figure 1:
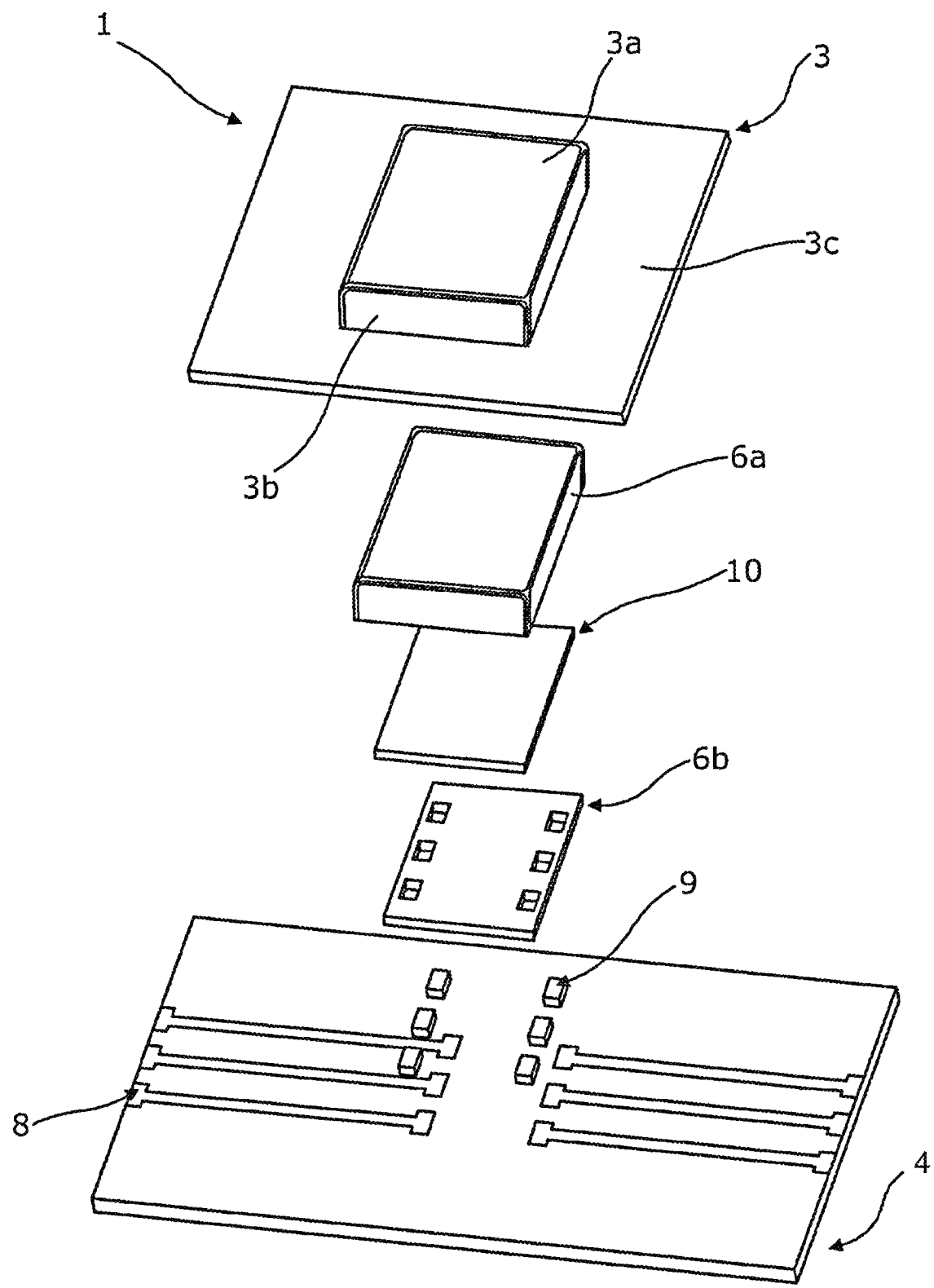
FIG. 1 is a cross section of an assembly comprising encapsulated electronic componentry.
Figure 2:
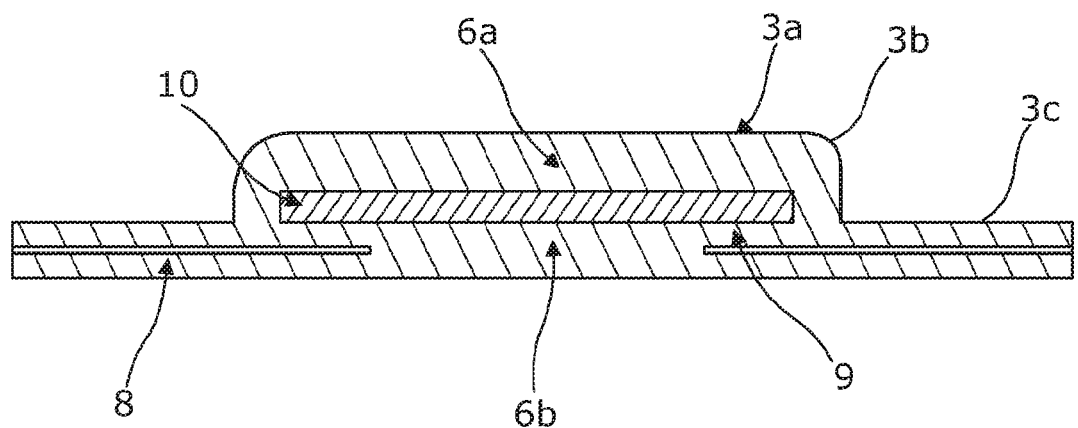
FIG. 2 is an exploded perspective view of the assembly of FIG. 1, which shows various components of the assembly of FIG. 1.

There are now described various embodiments of encapsulated electronic componentry which are adapted to be incorporated into a yarn, or into a textile. This advantageously allows the creation of a functional fabric, various applications of which are described below. Like reference numerals are used to denote the same or substantially the same features, where appropriate for different embodiments.

With reference initially to FIG. 1, there is shown an encapsulated electronic assembly 1. The assembly comprises a first flexible substrate 3, and a second flexible substrate 4. The first flexible substrate 1 comprises a pre-formed region 3a. This provides a relief or raised formation in the form of a protrusion or boss. This defines an internal volume which serves to at least in part accommodate the electronic componentry 10.

As can be seen from FIG. 1, the substrate 3 comprises a transitional region 3b, which serves to define the height or upstand of the region 3a, from the 'lower' or basal portion 3c of the first substrate 3. The transitional region includes a curved cross-sectional profile. This serves to reduce or minimise any the effect of any damaging or structurally detrimental bending forces experienced at those regions which could result in mechanical failure. Sharp corners can act as stress raisers concentrating the stress, whereas curved junctions avoid this and allow for a more even stress distribution.

The substrate 3 is formed of a flexible polymer material, such as Kapton®.

The electronic componentry 10 comprises a semiconductor die, such as a bare silicon die, having a thickness of around 250 µm. The electronic componentry may provide different functionalities, some of which are listed below.

The second flexible substrate 4 is, in contrast to the first flexible substrate, substantially planar, and is of the same material as the first flexible substrate. The second flexible substrate is provided with conductive tracks and bumping pads, shown generally by reference numeral 8. These are connected to the silicon die 10 by way of portions of conductive adhesive/soldering paste 9. At the end of each flexible substrate there could be provided a connector to allow a mechanical and electrical attachment to external electronics.

The assembly 1 further comprises an upper layer 6a of adhesive or filler, and a lower layer 6b of a flexible adhesive or filler. These are provided during fabrication of the assembly 1, and serve to internally encapsulate the electronic componentry. The fabrication process of the assembly is described in more detail below.

Figure 3:
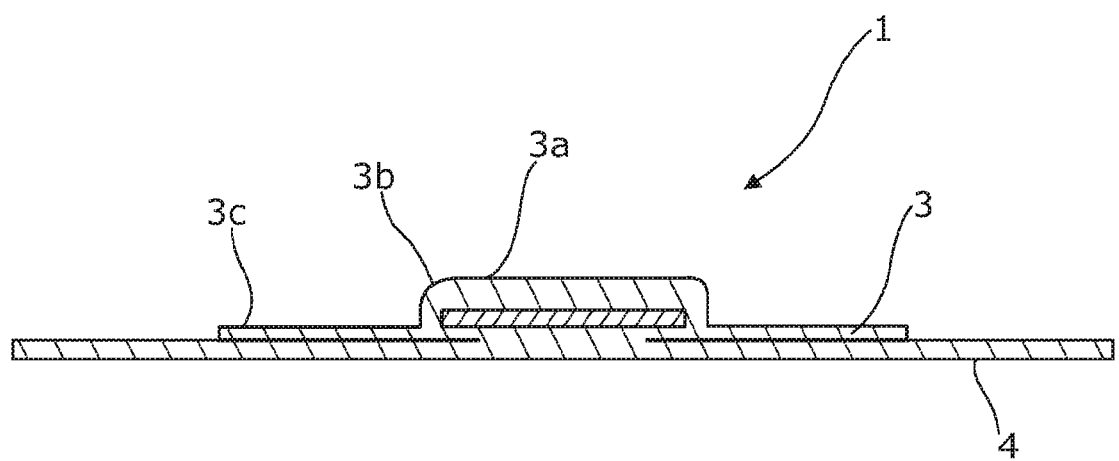
FIG. 3 is an extended cross-sectional view of the assembly shown in FIG. 1.

As can be seen in FIG. 3. The first substrate 3 is located atop the second substrate 4.

Highly advantageously, the electronic componentry 10 provided by the silicon die is located on a neutral bending axis. This results in the componentry 10 being subjected to significantly reduced or minimised bending forces, which occur when the yarn to which the encapsulated assembly is incorporated is bent or twisted in use, such as during a wash cycle, where for example the yarn is part of a wearable garment. The adhesive/filler layers 6a and 6b, ensure that the componentry is located and maintained at the neutral axis, and the thicknesses of those layers are chosen accordingly.

One application of the above embodiment is an (invisible) Radio Frequency Identification (RFID) tag. RFID is a technology that incorporates the use of electromagnetic coupling in the radio frequency (RF) band to identify an object. RFID allows tagging of assets, inventory, personnel and patients with a tiny electronic tag.

The packaging approach described above can combine with a bespoke antenna design to achieve a thin RFID filament that can be woven into a textile or incorporated into a yarn. As such, this RFID tag can be placed invisibly into a textile RFID tags and can be used in numerous contexts, including:

Tracking textile products, providing quality control and facilitating end of life recycling and re-use of textiles. This allows for a high specificity of textile sorting which means that the waste stream can be processed to achieve best value.

Monitoring wearer's safety, such as tracking and recording of safety PPE or other relative products at a construction site, tracking medical items/equipment at hospitals, for security.

Tracking workflow, such as tracking patients and new born babies in hospital or tracking employees at a special working environment.

Providing security access control as an alternative to the access card.

Garment washing and laundering. Invisible tags allow laundry owners to optimise workflows, ensure adequate stock levels, and reduce inventory losses.

Tracking high-turnover products, like clothing.

Protecting high-end brands and improving anti-counterfeit measure. Fake luxury goods are a major problem for companies the world over. High end products like Chanel bags can be embedded with a unique RFID tag, which customers can scan in-store to provide authentication as well as provides an alternative store security measure to conventional pin-in security tags which are likely to damage the clothing.

Improving the brand loyalty by enhancing customer experience in store, such as real time stock availability check (e.g. click and collect), allowing retailers to recognise a customer as he/she walks into the store, offering speed check-out and automatic shopping.

Invisible tracking of prison inmates.

In addition to the application to RFID, the invention also finds application in smart fabrics generally since the invention provides for smart fabrics with high durability. Durability is a key issue holding back the commercial deployment of smart fabrics. Smart fabrics have application in the military, healthcare, sports and fitness, consumer markets and creative and cultural industries applications. Typical applications include:

Sleep activity monitoring via accelerometers in bedding.

Activity monitoring via accelerometers in clothing for fitness.

Activity monitoring via accelerometers for proof of well-being (e.g. military, coal miners).

Activity monitoring via accelerometers for communication of information via gestures.

LED display on clothing for visibility for example when cycling.

LED display on clothing/bags for decoration in fashion applications.

Integration of sensors in a smart bra to improve posture support and breathing.

Sofas/carpet/upholstery with periodic lighting via LEDs. These applications would not require washing but would benefit from the improved durability offered by the invention.

Lighting strips in mobile phone case.

Moisture detection in underwear via humidity sensors.

Interactive clothing for fashion/consumer applications.

Conductive yarns and LEDs for automotive head liners.

Water level monitoring in hydration bladder in back pack.

LED and sensing in motorcycle jacket/helmet.

Figure 4:
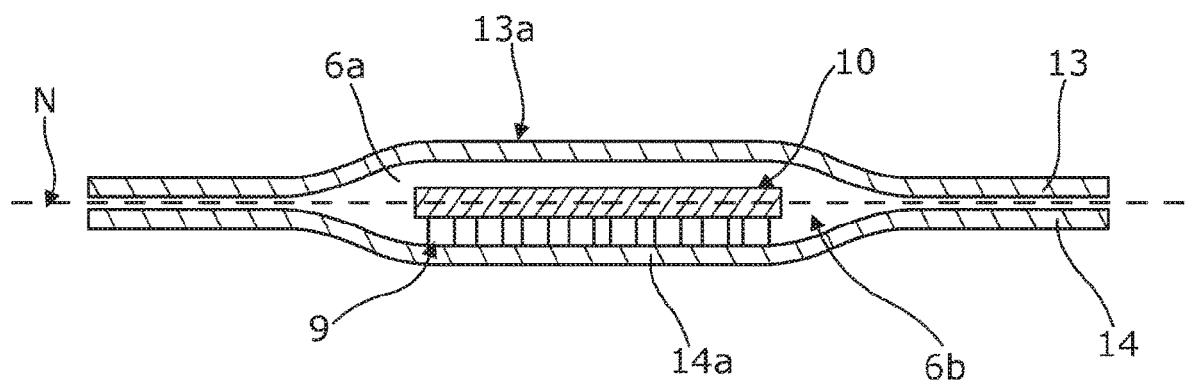
FIG. 4 shows a second embodiment of the invention.

Reference is made to FIG. 4 which shows a second embodiment of the invention which comprises two flexible substrates 13 and 14, which are both preformed with a relief region, 13a and 14a, and which are brought together to encapsulate electronic componentry. The componentry 10 is located on a neutral bending plane N.

Figure 5:
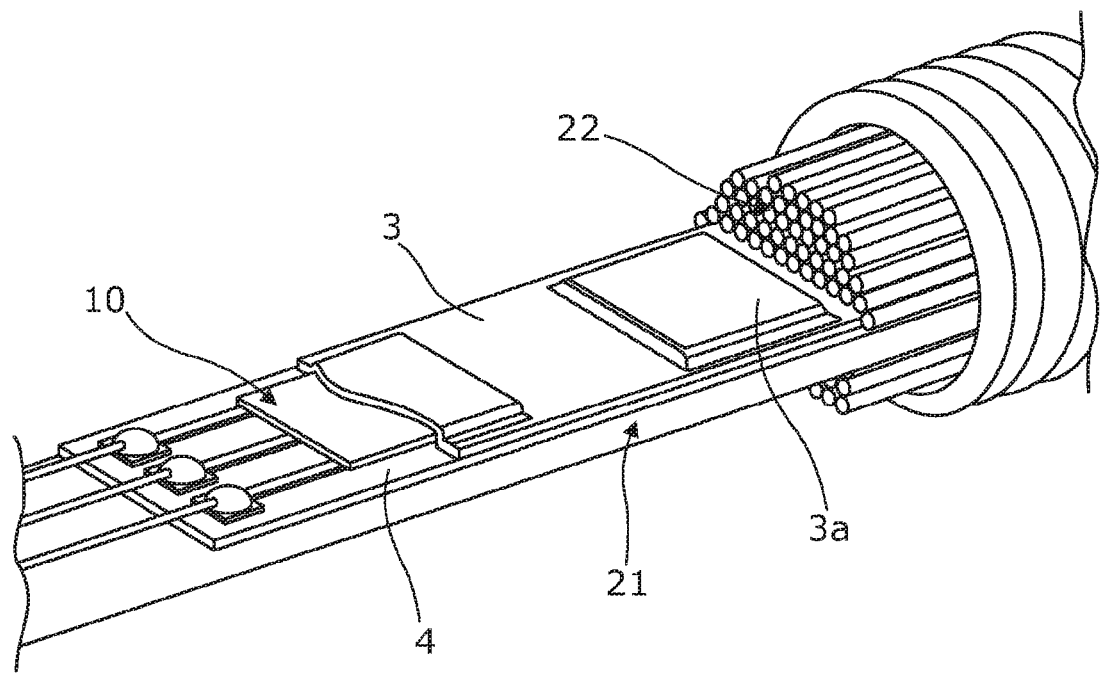
FIG. 5 shows a third embodiment of the invention.

Reference is made to FIG. 5, which shows a further embodiment in which multiple encapsulated assemblies are incorporated into a yarn. In FIG. 5, multiple encapsulated assemblies (or pods) are distributed along part of the length of the yarn. It will be appreciated that the second flexible substrate is provided as a long, single strip which extends along the respective length. The second substrate 4 is provided on a carrier yarn 21, which may comprise synthetic polymer fibers such as Zylon® fibers. Packing fibers 22 are also provided which sandwich the carrier yarn 21 and the encapsulated assemblies therebetween. Externally of the packing fibers and the carrier and the encapsulated assemblies, there is provided covering fibers (which may comprise one or more of PE, PA, Wool, Cotton, Silk). This arrangement results in the encapsulated assemblies being substantially centrally located within the yarn.

The process used in the manufacture of the assembly is as follows. Firstly, the electronic component is attached with solder or adhesive to the substrate which contains conductive tracks. The gap below the component and the flexible substrate is filled (under-filling) with flexible material which is other than solder. Finally, the relief region which does not house the component is entirely or partially filled with another or the same flexible material which conveniently also acts as the adhesive to attach the two flexible substrates together. The same material is also applied to the rest of one or both of the flexible substrates. The flexible substrates are then placed in a vacuum to remove bubbles, which may be for up to around an hour. The entire assembly is then placed in an oven to cure the adhesive filling.

It will be appreciated that the thicknesses and stiffnesses of all the materials (solder/adhesive, under-fill, relief fill (6a and 6b)) can be selected to adjust the position of the neutral axis to ensure the electronic component is situated in the neutral axis of the assembly. The position of the neutral axis may be further adjusted by having different thicknesses, and differing materials, of flexible substrate.

In another embodiment, in place of the use of a substrate with a pre-formed relief, a vacuum application process is used to apply a layer which is located atop the componentry. This potentially simplifies the overall manufacturing process in that it is not required to produce a substrate which has a preformed relief, such as the first flexible substrate 3 described above. One such method for realising the package assembly using a vacuum forming process uses an adhesive coated thermoplastic film. The film is heated such that it becomes soft and a vacuum applied that brings the film down over the circuit where the adhesive bonds the film to the circuit substrate and components. Once applied, the topology/relief of the film then substantially conforms to the substrate/componentry. The position of the neutral axis can be maintained at the surface of the circuit by using the appropriate thermoplastic film thickness which can be calculated using known equations (see below) and given the Young's modulus of the substrate material and the thermoplastic film. The relevant equation may be expressed as:

$$\bar{y} = \frac{\sum_{i=1}^{n} E_i x_i h_i \left(2 \sum_{j=1}^{i} h_j - h_i\right)}{2 \sum_{i=1}^{n} E_i x_i h_i}$$

Where $E_i$, $x_i$ and $h_i$ represent the elastic modulus, width and thickness of the layer of the assembly where i=1 is the circuit substrate and i=2 is the top encapsulating film respectively. "n" is the total number of layers and y is the neutral axis position.

The invention claimed is:

1. An encapsulated assembly of electronic componentry incorporated inside a yarn, and the assembly embedded inside the yarn by packing fibers, and the packing fibres enclosed within a covering material or covering fibres, and the assembly comprising a flexible substrate, and a film which encapsulates the electronic componentry, the film comprising at least one relief region configured to define a volume which at least in part accommodates the electronic componentry, said relief region being flexible to define said volume by conformal relief when applied to encapsulate the componentry which is disposed on the flexible substrate, and the componentry located substantially at a neutral axis of the assembly, wherein the neutral axis being an axis at which the componentry experiences little or substantially no flexure, or only a minimum of flexure, when a bending force is applied to the assembly, and the componentry forming an elongate flexible circuit.

2. An assembly as claimed in claim 1 in which the at least one substrate comprises a transitional portion which connects the relief region to a surrounding part of said flexible substrate.

3. An assembly as claimed in claim 2 in which the transitional region forms a side wall of the relief region.

4. An assembly as claimed in claim 2 in which the transitional portion has a curved shape when viewed in cross-section.

5. An assembly as claimed in claim 1, in which the electronic componentry comprises at least one of a semiconductor die and an electronic component.

6. An assembly as claimed in claim 1, in which the flexible substrate comprises electrically conductive tracks and/or conductive pads.

7. An assembly as claimed in claim 1, in which a filler or adhesive is provided in said relief region.

8. An assembly as claimed in claim 7 in which the filler or adhesive comprises a flexible material.

9. An assembly as claimed in claim 1 in which the electronic componentry is arranged to at least one of provide an output, receive an input and process at least one of data and signals.

10. An assembly as claimed in claim 1 in which the electronic componentry comprises at least one of an integrated circuit, a battery, an antenna, an energy harvester, a connector, a sensor and an actuator.

11. An assembly as claimed in claim 1 in which the flexible substrate comprises one or more of conductive interconnects, bond pads, solder bumps and adhesive.

12. An assembly as claimed in claim 1 in which said relief region is flexible to define said volume by conformal relief.

13. An assembly as claimed in claim 1 further comprising packing fibres which embed the carrier yarn and the assembly.

14. An assembly as claimed in claim 1 which comprises an external covering material or external covering fibres.

15. A method of manufacturing a yarn which incorporates encapsulated electronic componentry inside of the yarn, the method comprising the steps of: bringing together a flexible substrate and a film, and in which electronic componentry is provided on the flexible substrate, applying the film to encapsulate the componentry such that it adopts a conformal relief when so applied, and the componentry forming an elongate flexible circuit, and embedding the encapsulated electronic componentry inside the yarn with packing fibers and the packing fibres enclosed with covering fibres or a covering material.

16. A method as claimed in claim 15 which comprises the step of applying at least one of the substrates by way of a vacuum application process.

17. A method as claimed in claim 15 in which the film comprises an adhesive coated thermoplastic film, and is applied to the encapsulate the componentry by way of a vacuum application process.

18. A method as claimed in claim 17 which comprises heating the adhesive coated thermoplastic film such that it becomes soft and further comprising applying a vacuum that brings the film down over the componentry.

* * * * *